United States Patent [19]
Roll et al.

[11] Patent Number: 5,349,270
[45] Date of Patent: Sep. 20, 1994

[54] TRANSFORMERLESS FLUORESCENT LAMP OPERATING CIRCUIT, PARTICULARLY FOR A COMPACT FLUORESCENT LAMP, WITH PHASE-SHIFTED INVERTER CONTROL

[75] Inventors: Ulrich Roll; Werner Bernhard, both of Augsburg; Ludwig Reiser, Gersthofen, all of Fed. Rep. of Germany

[73] Assignee: Patent-Treuhand-Gesellschaft F. Elektrische Gluehlampen mbH, Munich, Fed. Rep. of Germany

[21] Appl. No.: 935,004

[22] Filed: Aug. 25, 1992

[30] Foreign Application Priority Data

Sep. 4, 1991 [DE] Fed. Rep. of Germany ....... 4129430

[51] Int. Cl.⁵ ............................................. H05B 37/02
[52] U.S. Cl. .................................. 315/209 R; 315/219; 315/227 R; 315/232; 315/238; 315/239; 315/242; 315/DIG. 7
[58] Field of Search ............... 315/209 R, 219, 227, 315/239, 242, 232, 238, DIG. 7

[56] References Cited

U.S. PATENT DOCUMENTS

| | | | |
|---|---|---|---|
| 4,438,372 | 3/1984 | Zuchtriegel | 315/224 |
| 4,572,989 | 2/1986 | Zuchtriegel | 315/244 |
| 4,710,682 | 12/1987 | Zuchtriegel | 315/244 |
| 5,008,596 | 4/1991 | Kastl et al. | 315/205 |
| 5,140,224 | 8/1992 | Kakitani et al. | 315/219 |

FOREIGN PATENT DOCUMENTS

| | | |
|---|---|---|
| 0062276 | 10/1982 | European Pat. Off. |
| 0093469 | 11/1983 | European Pat. Off. |
| 0221864 | 5/1987 | European Pat. Off. |
| 0420251 | 4/1991 | European Pat. Off. |
| 3943272 | 7/1991 | Fed. Rep. of Germany |
| 4011742 | 10/1991 | Fed. Rep. of Germany |

*Primary Examiner*—Robert J. Pascal
*Assistant Examiner*—Reginald A. Ratliff
*Attorney, Agent, or Firm*—Frishauf, Holtz, Goodman & Woodward

[57] ABSTRACT

To eliminate the necessity for a saturated or air gap inductance to provide a feedback circuit for a self-exciting oscillator including two active electronic switches (T1, T2), for example MOSFETs, an auxiliary winding (HW1, HW2, ... HW11) is inductively coupled to the resonance inductance (L2) present in the circuit for the discharge lamp (LP) anyway; and a pulse shaping - phase shifting network (R3, C3; R4, C4 ...), devoid of inherent resonance, coupling the auxiliary winding to the active switching elements. The pulse shaping - phase shifting network is formed of a one or multiple-stage RC low-pass circuit, connected serially between the auxiliary winding and the control input, for example the gate, of the active switching element. The RC network can be constructed with variable elements, for example including PTC resistors, a varistor or the like, and may include a current source, protective circuits to protect against voltage peaks including Zener diodes. The low-pass characteristics of the pulse shaping - phase shifting network permits switching of the active semiconductor switches after the maximum current flow.

18 Claims, 5 Drawing Sheets

TRANSFORMERLESS FLUORESCENT LAMP OPERATING CIRCUIT, PARTICULARLY FOR A COMPACT FLUORESCENT LAMP, WITH PHASE-SHIFTED INVERTER CONTROL

Reference to related patents, the disclosures of which are hereby incorporated by reference, assigned to the assignee of the present application: U.S. Pat. No. 4,710,682, Zuchtriegel U.S. Pat. No. 5,008,596, Kastl et al

FIELD OF THE INVENTION

The present invention relates to a circuit to operate a low pressure discharge lamp, such as a fluorescent lamp, and especially to an operating circuit for a compact fluorescent lamp.

BACKGROUND

Fluorescent lamps operate more efficiently at higher frequencies than at power frequencies. Operating circuits for fluorescent lamps, thus, frequently use self-oscillating circuits, having active switching elements, such as transistors, which are supplied with a control signal or with control energy to control the active switches to change state at the desired operating frequency. Circuits to supply such low pressure discharge lamps usually used a separate current transformer which was constructed either as a saturated current transformer or a transformer having an air gap. Such separate current transformers were constructed to interrupt furnishing a control signal after a predetermined voltage-time integral had elapsed. In the gap between switching pulses, sufficient time is available to clear the base or gate circuit of charge carriers, to ensure that the switching elements are reliably disconnected. Circuits of this type are described in the referenced U.S. Pat. Nos. 5,008,596, Kastl et al; 4,710,682, Zuchtriegel.

The publication by Siemens AG, "Elektronikschaltungen" ("Electronic Circuits") by Walter Hirschmann, chapter "Electronic Accessory Apparatus for New Fluorescent Lamps", pp. 147–151, is a general literature reference for the circuits described.

Circuits of these types require a current transformer for control of the active switching elements. Such a current transformer or similar element is comparatively expensive since it requires a separate winding or wound structure. Ferrite cores are used for the transformer windings. Such ferrite cores have manufacturing tolerances which undesirably and substantially affect the operating parameters when used in saturated transformers.

THE INVENTION

It is an object to provide a circuit of the well known general type described in the referenced patents in which, however, a saturated transformer or a separate transformer element need not be used. The circuit should be simple so that it can be manufactured inexpensively.

Briefly, a self-excited oscillating circuit having at least one active switching element, and preferably two transistors, which may be field effect transistors, is provided, connected to a feedback circuit. A resonance circuit having at least one resonance inductance and at least one resonance capacitative element is provided, forming part of the oscillating circuit. In accordance with a feature of the present invention, the feedback circuit controlling the self-excited oscillating circuit is formed by at least one auxiliary winding inductively coupled to the resonance inductance, and further having a pulse shaping and phase shifting network, devoid of inherent resonance, coupling the auxiliary winding to the active switching element. Preferably, the pulse shaping and phase shifting network is formed by an RC low-pass circuit, which may be a one-stage or multiple-stage low-pass circuit.

Controlling the electronic active switches from an auxiliary winding on the resonance and current limiting inductance—which is necessary in the circuit anyway—in combination with a pulse shaping and phase shifting network which is so constructed that it is devoid of inherent resonance thus makes it possible to eliminate a separate current transformer. The pulse forming and phase shifting network does not have an individual pole point, that is, it does not form inherent, self-resonating effects. The control of the active switching element or, preferably, two active switching elements, is obtained by oscillation of the load circuit, the inherent frequency of which is determined in part by the resonance inductance or a resonance choke, and resulting capacitances.

The active switching portion of the circuit can utilize any type of self-oscillating switched-mode power supplies, such as single transistor flyback or forward converters, push-pull converters, symmetrical or asymmetrical half-bridge converters or full-bridge converters. In accordance with a preferred feature of the invention, the oscillating circuit uses one or more voltage controlled semiconductors, such as Metal Oxide Semiconductor Field Effect Transistors (MOSFETs), or Insulated Gate Bipolar Transistors (IGBTs). If such voltage control switching elements are used, the pulse shaping and phase shifting network is formed by a single-stage or multiple-stage RC low-pass circuit. The RC low-pass circuit is connected in series between the auxiliary winding and the gate or base of the respective active switching element.

The phase shifting portion in the pulse shaping and phase shifting network can be a variable phase shifting portion or it can be formed as an active phase shifting circuit, so constructed that an increased or elevated frequency is available to preheat the filaments of the low-pressure discharge lamp. To obtain suitable pulse shaping, additional circuit elements such as resistors, diodes or a varistor may be used.

In some circuits it is desirable to utilize an active or a passive charge carrier clearing network, utilizing for example an auxiliary transistor connected between the phase shifter and the respective switching element. This results in accelerated turn-off of the active switch, or the active switches. Protective elements, for example Zener diodes, can protect the gate or base, respectively, of the active switching element, or elements.

Some circuits have an integrated isolating or economizing transformer. In such circuits, the resonance inductance can be integrated with the transformer, coupled thereto by stray or leakage inductance. The auxiliary winding can then be coupled to the secondary of the transformer.

DRAWINGS

DETAILED DESCRIPTION

Figure 1:
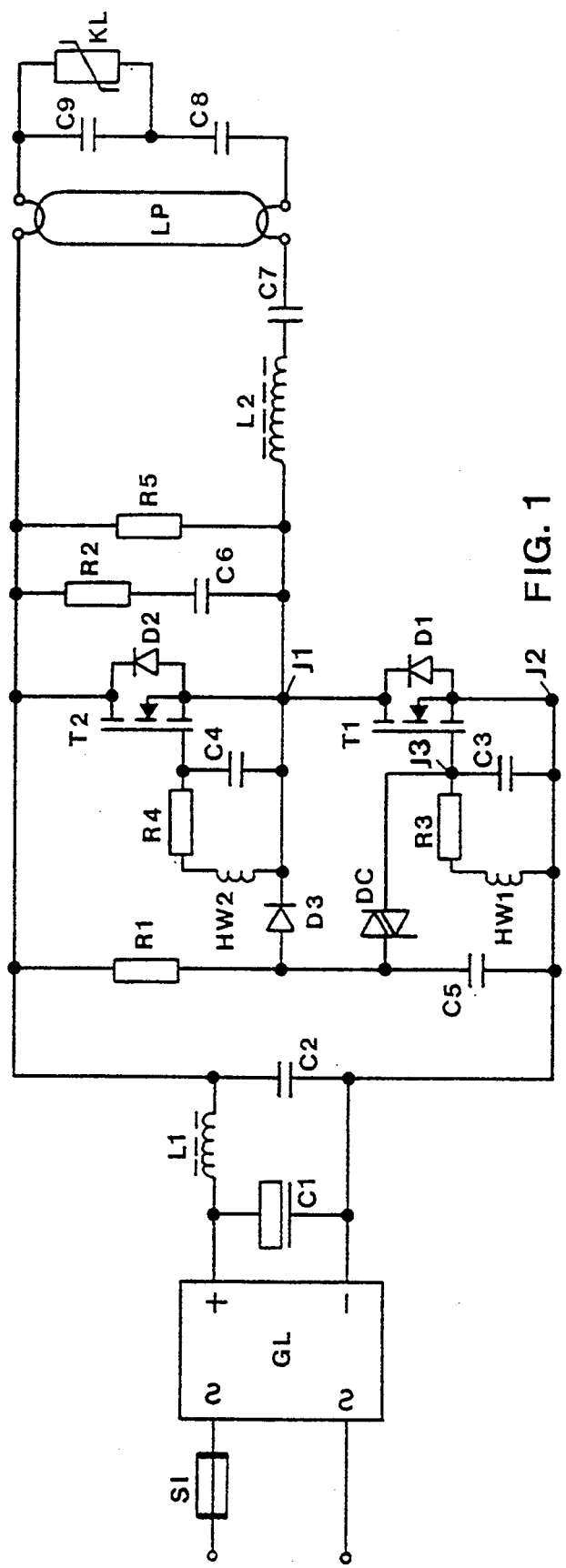
FIG. 1 is a schematic circuit diagram of the operating circuit in which the oscillator portion is constructed as a push-pull converter having MOSFET transistors.

FIG. 1 is a circuit diagram of a circuit having a push-pull half-bridge oscillator to operate a compact fluorescent lamp LP, for example having a rating of 20 W.

A rectifier GL is connected through a fuse SI to terminals of a power network, for example 120 V, 60 Hz. The output from the rectifier GL is connected to a smoothing capacitor C1 and an interference suppression choke L1 to the positive terminal of the supply circuit. The negative terminal of the capacitor is connected directly to the negative terminal of the supply circuit. A capacitor C2 is connected across the positive and negative terminals, and parallel to the smoothing capacitor C1.

The self-oscillating circuit has two active switching elements formed by MOSFET transistors T1, T2. Return flow diodes D1, D2 bridge across the source-drain terminals of the FET transistors T1, T2. A start-up circuit is provided having resistors R1, R5, capacitor C5, diode D3, and a diac DC. One terminal of the first electrode of the load formed by the lamp LP is connected through a capacitor C7 and a resonance inductance L2 with the center terminal between the two transistors T1, T2. One terminal of the second electrode is connected to the positive terminal of the circuit, that is, the output from the rectifier GL. A series resonance circuit formed by the resonance inductance L2, the coupling capacitor C7 and two resonance capacitors C8, C9 is provided. The two resonance capacitors C8, C9 are serially connected in the heating circuit of the filaments of the lamp LP. A positive temperature coefficient (PTC) resistor KL1 is connected across the capacitor C9. To decrease loading on the transistors, a series circuit formed by a resistor R2 and a capacitor C6 is connected in parallel to the switching path of the transistor T2.

In accordance with a feature of the present invention, the transistors T1, T2 are controlled into oscillation by auxiliary or helping windings HW1, HW2. These windings HW1, HW2 are applied on the resonance inductance, or choke L2, that is, wound on the same core. In addition, the gate or base connections to the active switches, that is, the transistors T1, T2, is coupled to the respective windings HW1, HW2 through a pulse shaping and phase shifting network in form of an RC low-pass circuit having, respectively, the resistor-capacitor combination R3, C3 and R4, C4.

Operation

The circuit is triggered into oscillation over the diac DC. The transistor T1 will become conductive, and will receive control voltage over the appropriately poled auxiliary winding HW1, wound on the core of the resonance choke L2. A sinusoidally rising current will flow through the choke L2 and the group of capacitors C7 to C9, and lamp LP coupled thereto. The voltage across the choke L2, and thus also across the auxiliary winding HW1, decreases in accordance with the relationship $$u(t) = -L \times di/dt \qquad (1).$$

The voltage reaches the zero cross-over at the sine-maximum of the choke current.

Let us first consider the operation without phase shifting, that is, without the RC circuits R3, C3, R4, C4: The control voltage of the transistor T1 will drop below the threshold voltage of the transistor T1 before the choke current has reached the sine maximum, to then disconnect the transistor T1. The current in the choke L2 will cause the voltage across the choke L2 to reverse since the transistor T1 is blocked, and will flow over the free-wheeling or parallel diode D2. The diodes D1, D2 can be integrated in the respective transistors, and diode D2 can be integrated in transistor T2. This current will flow through the capacitors C7 to C9, connected in parallel to the load, until the stored energy is used up, and passes through null or zero. Upon reversal of the voltage over the choke L2, and thus also over the auxiliary windings HW1 and HW2, transistor T1 is blocked or controlled to OFF by the negative gate voltage, and the transistor T2 is controlled ON during the operation of its parallel or free-wheeling diode D2. Current in the choke L2, after passing through zero, will further oscillate after passing through zero into the negative region (through T2, positive) until the control voltage over the auxiliary winding HW2 passes below the threshold voltage of the transistor T2, shortly before the sine maximum, so that the transistor T2 again is disconnected . The now again reversing voltage through the choke L2 and the auxiliary windings HW1 and HW2 control transistor T1 to become conductive or ON. Current can continue to flow through its parallel diode D1, from the choke L2. The previously described cycle will then repeat.

An operating frequency will result which is about twice the inherent frequency of the resonance circuit. This, however, does not make it possible to obtain a sufficiently high ignition voltage and/or to supply a suitably elevated operating voltage—with respect to the half-wave bridge voltage—to the load, that is, the lamp.

In accordance with a feature of the invention, thus, the RC low-pass circuits R3, C3 and R4, C4 are connected between the auxiliary windings HW1 and HW2, and the gate input to the transistors T1, T2, respectively. The function and effect of these circuits is that the control voltage on the gate will be phase-shifted and the turn-off threshold will be reached only after the maximum of the current in the resonance choke L2. Consequently, the control voltage also delays turning the respective transistor ON. That, however, is not disadvantageous since, as described above, the current, initially, flows through the respective parallel connected diode.

In addition to this phase shifting, the RC network protects the gate of the transistors with respect to voltage peaks which arise in the resonance choke L2 during switching. The low-pass circuits, and the inherently resulting phase shift, also shifts the operating frequency downwardly in the direction of the inherent frequency of the resonance circuit.

The result will be effective triggering of the resonance circuit for ignition. Even high resistance loads can be operated without excessive resonance effects.

The RC circuits should be so dimensioned that the turn OFF instant of the transistors T1, T2 is set, for ignition, at a determined phase angle of the throttle or choke current, so that the resonance maximum is precisely met, resulting in high ignition voltages. Even if the current supply network should be below rated level, for example by dimming with small lamp currents in a high resistance lamp, the operation will be stable due to the defined resonance elevation. At normal operation, or at excessive voltage in the network, and with higher lamp currents in a low resistance lamp, the compact fluorescent lamp LP connected in parallel to the resonance capacitors C8, C9, result in slow decay of the current in the resonance choke L2. Consequently, any excess resonance effect is highly damped, that is, the overall quality of the circuit is decreased, resulting in an effective shift of the inherent frequency to a lower level. There is variation in power output which is under-proportional to the variation in supply voltage.

A typical circuit for a 20 W compact fluorescent lamp, connected to a 120 V, 60 Hz a-c network, has the following components:

| | |
|---|---|
| SI | 1.6 A, M |
| GL | B 250 C 800 DM |
| C1 | 47 μF, 200 V |
| L1 | 150 μH |
| C2, C7 | 220 nF, 250 V |
| R1, R5 | 220 kΩ |
| C5 | 0.1 μF |
| R3, R4 | 1 kΩ |
| C3, C4 | 6.8 nF |
| T1, T2 (with D1, D2) | BSS 297 |
| D3 | 1 N 4004 |
| DC | NEC N 413 M |
| R2 | 22Ω |
| C6 | 1 nF |
| L2 | 1.2 mH; 200.5 windings core EF 16 |
| HW1, HW2 | 20 windings |
| C8 | 15 nF, 400 V |
| C9 | 10 nF, 400 V |
| KL1 | Siemens S 1380 P 120 |

Figure 2:
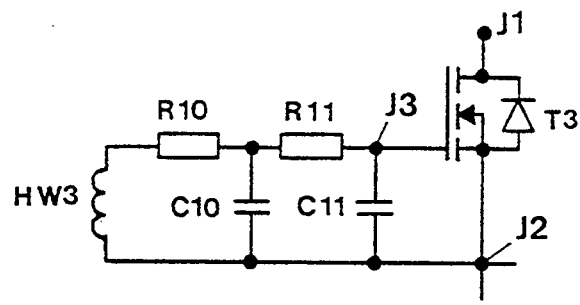
FIG. 2 is a fragmentary circuit diagram illustrating one embodiment of the pulse forming and phase shifting circuit.

FIG. 2 illustrates a portion of the circuit of FIG. 1 and, specifically, the control circuit for any one of the transistors T1, T2 and replacing the circuit of FIG. 1 between junctions J1, J2 and J3 (FIG. 1). FIG. 2, thus, shows, generally, a MOSFET transistor T3, an auxiliary winding HW3, which corresponds to one of the windings HW1, HW2, and a multiple low-pass circuit formed by resistors R10, C10, R11, C11, in which the multiple low-pass circuits are connected serially. This circuit provides for phase shift between the control voltage for the transistors and the maximum of the throttle current of 90°. If only one RC circuit is provided, the shift will be less than 90°. If the larger shift of 90° is desired, the circuit of FIG. 2 is recommended.

Figure 3:
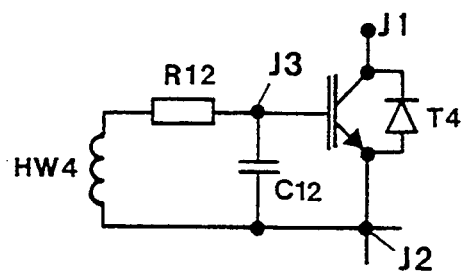
FIG. 3 illustrates another embodiment of the pulse forming and phase shifting circuit.

FIG. 3 illustrates a circuit identical to FIG. 1, except that the active element is an IGBT transistor T4. Of course, again, two or more transistors may be used in the oscillator circuit. The pulse shaping and phase shifting network is formed by an RC circuit R12, C12, corresponding to resistor R3 and capacitor C3 of FIG. 1, connected serially between the auxiliary winding HW4 corresponding to winding HW1 of FIG. 1 and the IGBT transistor T4.

Figure 4:
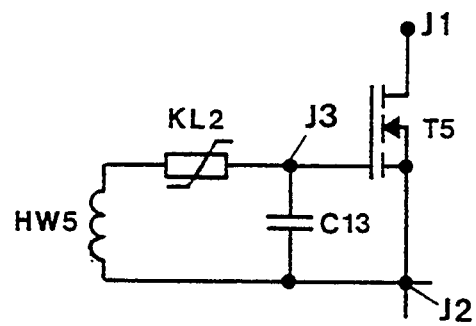
FIG. 4 illustrates a circuit with a variable phase shifter.

FIG. 4 shows a pulse shaping and phase shifting network in which the resistor is a PTC resistor KL2, connected similar to resistor R3 or R4 to the auxiliary winding HW5 and capacitor C13. The transistor is a MOSFET T5.

Figure 5:
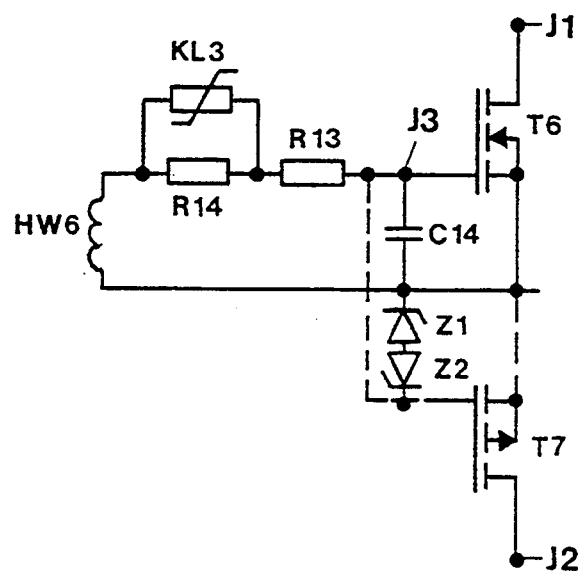
FIG. 5 illustrates another embodiment of a circuit with a variable phase shifter.

FIG. 5 illustrates a circuit in which, in addition to the RC low-pass circuit formed by resistor R13 and capacitor C14, a parallel circuit formed by a PTC resistor KL3 and a resistor R14 is connected between the auxiliary winding HW6 and resistor R13. If the oscillating circuit is a half-bridge circuit, as shown in FIG. 1, the second transistor T7 then need not have its own control circuit with a pulse shaping and phase shifting network. The transistor T6 can provide the necessary control. The MOSFET transistor then must be a P-channel transistor, and the transistor T6 an N-channel transistor. This permits direct connection of the gates of the two transistors T6, T7. The insulation of the gates which, in MOSFETs and IGBTs are insulated, can be protected against over-voltages during ignition of the lamp by two counter-poled Zener diodes Z1, Z2.

The PTC resistor KL2, KL3, respectively, causes preheating of the filaments of the fluorescent lamp at an increased frequency without resonance triggering; the frequency then shifts towards operating frequency due to the heating of the respective PTC resistor KL2, KL3. In FIG. 5, the connections between transistors T6, T7 are shown in broken lines for ease of illustration and explanation of the circuit and schematically indicates that the transistors T6, T7 are, respectively, of opposite type.

Figure 6:
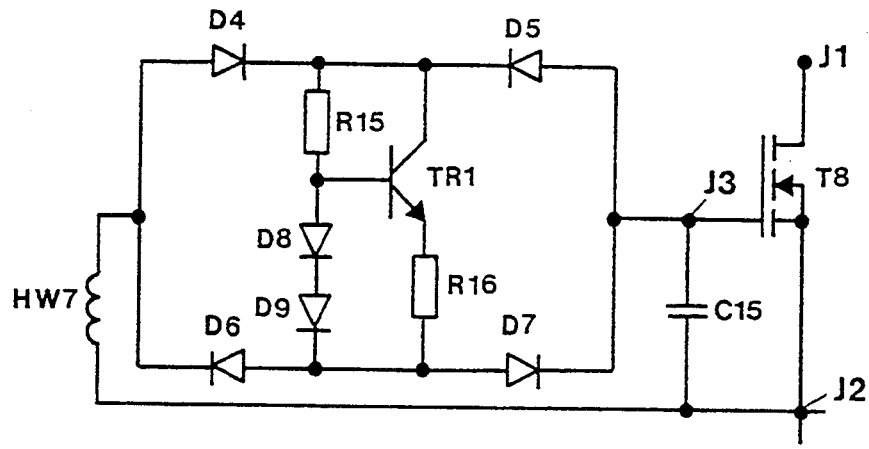
FIG. 6 illustrates a circuit with an active phase shifter.

The phase shifting element of the pulse shaping and phase shifting network can be an active element. FIG. 6 illustrates such a network having an active phase shifter. The resistance of the RC low-pass circuit is formed by a current source including a bridge rectifier formed by diodes D4, D5, D6, D7, the NPN transistor TR1, coupling resistors R15, R16 and current source diodes D8, D9. The current source is connected to correspond to the resistance in the RC network for the MOSFET transistor T8 between the auxiliary winding HW7 and the capacitor C15. This current source can be constructed as an integrated circuit element.

Figure 7:
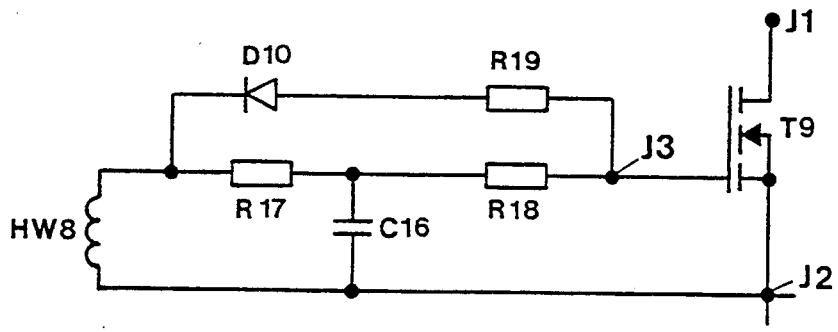
FIG. 7 illustrates one embodiment of the circuit with an additional pulse forming network.
Figure 8:
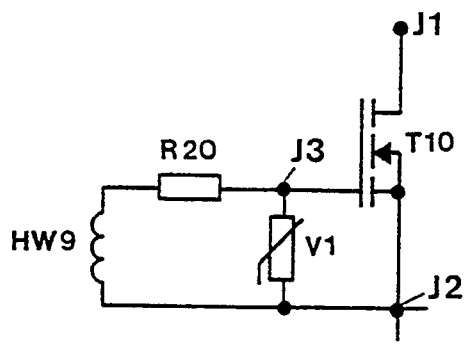
FIG. 8 illustrates another embodiment of the circuit of FIG. 7.

Pulse shaping can be obtained by additional pulse shaping elements, as shown in FIGS. 7 and 8.

FIG. 7 shows an RC low-pass circuit formed by resistor R17 and capacitor C16, connected as a network between the auxiliary winding HW8 and the MOSFET transistor T9. A further resistor R18 and a network formed by resistor R19 and diode D10 are connected between the gate input of the transistor T9 and the RC circuit formed by resistor R17, C16. Diode D10 is poled in d-c current blocking direction. The pulse shaping obtained by the circuit increases the dead time of the switching transistor T9 and improves its turn-off behavior.

FIG. 8 illustrates a RC low-pass circuit formed by a resistor R20 and a varistor V1 connected between the auxiliary winding HW9 and the gate input of the MOS- FET transistor T10. The parasitic capacity of the varistor is used as the capacity in the phase shifting network. The varistor provides for protection of the gate due to over voltage upon ignition.

Figure 9:
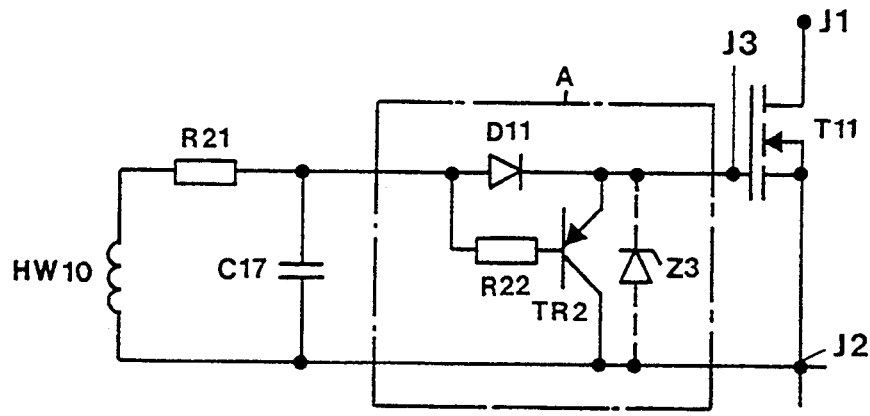
FIG. 9 illustrates a circuit in accordance with the present invention with an additional charge carrier clearing network for one of the electronic switching elements.

In some circuits it is desirable to provide an additional charge carrier removal network. FIG. 9 illustrates such a removal network A, formed by a PNP transistor TR2, which has its collector-emitter path connected in parallel to capacitor C17 of the RC low-pass circuit formed by resistor R21 and capacitor C17 for the MOSFET transistor T11. Similarly, the circuit of FIG. 10 includes a PNP transistor TR3 having its collector-emitter path connected parallel to the capacitor C18 of the low-pass circuit formed by resistor R23 and capacitor C18 for the MOSFET transistor T12. The gate input of the transistor TR2, TR3, respectively, is connected to the respective junction with the resistor R21, R23, and the capacitor C17, C18, respectively. A diode D11, D12 is connected, respectively, between this junction and the emitter input of the respective transistor TR2, TR3.

Figure 10:
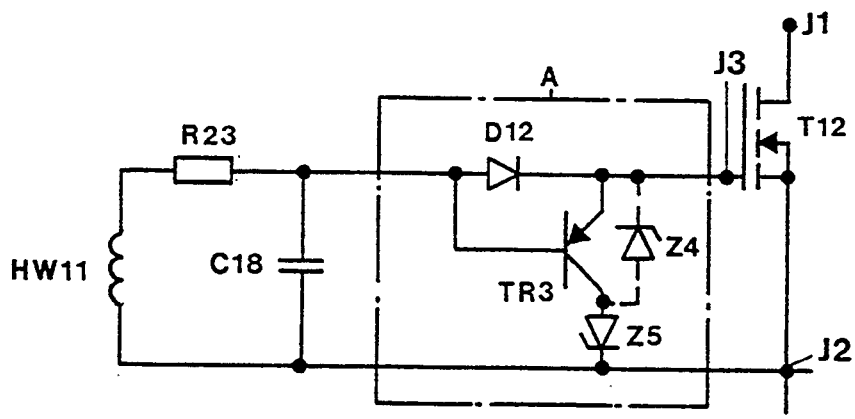
FIG. 10 illustrates another form of a charge carrier clearing network.

The operation of the circuits is effectively the same. The transistor TR2, TR3, respectively, results in rapid turn OFF of the MOSFET transistor T11, T12. The network A additionally includes a gate protection element in form of Zener diodes. The Zener diodes Z3, Z4 can be connected in parallel to the collector-emitter path of the respective charge removal transistor TR2, TR3, as seen in FIGS. 9 and 10. Possibly, a further Zener diode Z5 can be provided between the collector of the transistor TR3 and the reference potential.

Various changes and modifcations may be made, and any features described herein in connection with any one of the embodiments may be used with any of the others, within the scope of the inventive concept.

Figure 11:
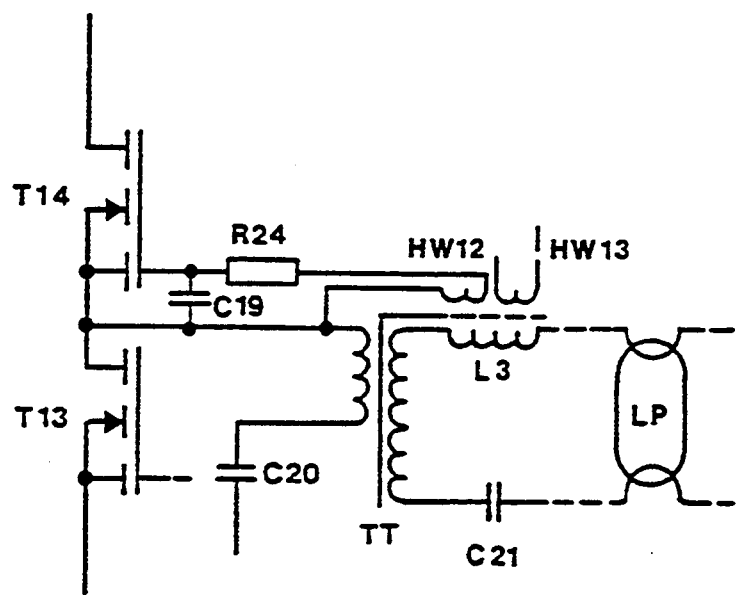
FIG. 11 illustrates a circuit in accordance with the present invention with an integrated isolating transformer.

FIG. 11 shows a circuit in accordance with the invention having an integrated isolating transformer TT and a resonance inductance L3. The pulse shaping and phase shifting network is formed by a resistor R24 and a capacitor C19 coupled between the gate of the transistor T13, respectively T14, and the auxiliary winding HW12, respectively HW13. The circuit further includes decoupling capacitors C20, respectively C21, connected between the secondary of the transformer TT and the electrode, respectively between the primary of the transformer TT and the negative terminal of the rectifier. The resonance inductance L3 may be a discrete inductance or may be integrated in the isolating transformer over leakage inductance.

We claim:

1. For combination with a low-pressure discharge lamp (LP),
   an operating circuit for high-frequency operation of the lamp, said operating circuit comprising
   a power network rectifier (GL including a filter (C1) for providing d-c output electrical energy, and connected thereto;
   a self-excited osillator circuit connected to said rectifier having at least one active switching element (T1, T2);
   and a lamp supply circuit including
   a resonance circuit coupled to the lamp and having at least one resonance inductance (L2) and at least one capacitative element (C8, C9) connected to said oscillator circuit, and
   wherein the oscillator circuit includes, in accordance with the invention,
   a feedback circuit which comprises at least one auxiliary winding (HW1, HW2, ... HW11) inductively coupled to the resonance inductance (L2); and
   a pulse shaping - phase shifting network (R3, C3; R4, C4; R10, C10, R11, C11; R12, C12) devoid of inherent resonance, coupling the auxiliary winding to the active switching element.

2. The operating circuit of claim 1, wherein the pulse shaping - phase shifting network devoid of inherent resonance comprises a low-pass RC circuit having at least one circuit stage.

3. The operating circuit of claim 2, wherein said RC low-pass circuit comprises a plurality of low-pass circuit stages.

4. The operating circuit of claim 2, wherein the RC pulse shaping and phase shifting network is coupled in series with respect to the auxiliary winding (HW1 ... HW11) and the control input of the at least one active switching element.

5. The operating circuit of claim 1, wherein the at least one switching element comprises a field effect transistor, optionally a metal oxide semiconductor field effect transistor (MOSFET) or an insulated gate bipolar transistor (IGBT).

6. The operating circuit of claim 1, wherein the pulse shaping - phase shifting network comprises at least one variable impedance element.

7. The operating circuit of claim 6, wherein the pulse shaping - phase shifting network comprises a resistor component and a capacitor component network; and
   wherein the resistor component comprises, at least in part, a positive temperature coefficient (PTC) resistor (KL2, KL3).

8. The operating circuit of claim 7, wherein the resistor component of the pulse shaping - phase shifting network comprises (FIG. 5) a resistor (R13) serially connected with the auxiliary winding (HW6) and further, serially connected therewith, an ohmic resistor (R14) and a PTC resistor (KL3) connected in parallel to said ohmic resistor (R14).

9. The operating circuit of claim 6, wherein (FIG. 6) the resistor component of the pulse shaping - phase shifting network comprises an active element (TR1) and circuit elements (D4–D9, R16) connected to said active element.

10. The operating circuit of claim 1, wherein (FIG. 7) said pulse shaping - phase shifting network includes a further pulse shaping circuit branch, said pulse shaping - phase shifting network comprising a resistor (R17), serially connected with said auxiliary winding (HW8), and a capacitor (C16) connected across the series connection of said resistor (R17) and said auxiliary winding;
   wherein said further pulse shaping current branch comprises a further resistor (R18) connected to a junction between said capacitor (C16) and said resistor (R17); and
   a series circuit comprising an additional resistor (R19) and a diode (D10) connected between the terminal of said further resistor (R18) remote from said junction and a further junction between said resistor (R17) and said auxiliary winding.

11. The operating circuit of claim 1, wherein (FIG. 8) said pulse shaping - phase shifting network comprises a resistor (R20) serially connected with said auxiliary winding (HW9); and
   a varistor (V1) connected across the series circuit formed by said resistor and auxiliary winding.

12. The operating circuit of claim 1, further including (FIGS. 9, 10) a charge carrier removal network (A) coupled to the at least one active switching element (T11, T12).

13. The operating circuit of claim 12, wherein the pulse shaping - phase shifting network comprises a resistor element - capacitor element circuit;

and wherein the charge carrier removal network (A) comprises a transistor (TR2, TR3) having its collector-emitter path connected in parallel to the capacitor element (C17, C18) of the pulse shaping and phase shifting network (R21, C17; R23, C18), and is connected between the capacitor element (C17, C18) and the control input of the active switching element (T11, T12).

14. The operating circuit of claim 5, further including overvoltage protective circuit elements connected to the control terminal of the active switching element to protect insulation of the control terminal with respect to overvoltage during ignition of the lamp.

15. The operating circuit of claim 14, wherein said active switching element comprises a transistor (T6, T7, T11, T12) and said control terminal comprises the gate or base terminal of the transistor.

16. The operating circuit of claim 14, wherein the protective circuit elements comprise Zener diodes (Z1-Z5).

17. The operating circuit of claim 1, wherein said operating circuit includes an isolating transformer (TT), or a low power - economy operation transformer;

said resonance inductance (L3) being inductively coupled to said isolating or economy operation transformer, and the auxiliary winding (HW12, HW13) is coupled to the secondary of said transformer.

18. The operating circuit of claim 17, wherein the resonance inductance (L3) is physically integrated with the structure of said transformer.

* * * * *